(12) United States Patent
Sung

(10) Patent No.: US 10,855,260 B1
(45) Date of Patent: Dec. 1, 2020

(54) TRANSMITTER CIRCUIT AND OPERATION METHOD

(71) Applicant: Realtek Semiconductor Corporation, Hsinchu (TW)

(72) Inventor: Ya-Hsuan Sung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/931,645

(22) Filed: Jul. 17, 2020

(30) Foreign Application Priority Data

Mar. 2, 2020 (TW) .............................. 109106774 A

(51) Int. Cl.
- *H03K 3/037* (2006.01)
- *H03G 3/30* (2006.01)
- *H03K 19/20* (2006.01)
- *H03F 3/24* (2006.01)

(52) U.S. Cl.
CPC .......... *H03K 3/0377* (2013.01); *H03F 3/245* (2013.01); *H03G 3/30* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 6,615,301 B1* | 9/2003 | Lee | ...................... | G06F 13/4072 326/21 |
| 7,005,891 B2* | 2/2006 | Lee | ...................... | G06F 13/4072 326/26 |
| 7,447,930 B2* | 11/2008 | Yeh | ...................... | G06F 13/4068 713/324 |
| 7,522,659 B2* | 4/2009 | Lacy | ................... | G06F 13/4072 326/83 |
| 2004/0258166 A1* | 12/2004 | Camara | ............. | H04L 25/03885 375/257 |
| 2011/0291733 A1* | 12/2011 | Yano | ................ | H03K 19/00361 327/306 |

* cited by examiner

*Primary Examiner* — Lincoln D Donovan
*Assistant Examiner* — Khareem E Almo
(74) *Attorney, Agent, or Firm* — Locke Lord LLP; Tim Tingkang Xia, Esq.

(57) ABSTRACT

A transmitter circuit includes a slew rate control circuit, a hysteresis circuit, a logic control circuit, and an amplifier circuit. The slew rate control circuit controls a slew rate of an input signal to generate a first output signal. The hysteresis circuit generates a first control signal according to the first output signal. The logic control circuit generates a second control signal and a third control signal according to the input signal and the first control signal. The amplifier circuit generates a second output signal according to the first output signal, the second output signal, the second control signal, and the third control signal.

20 Claims, 5 Drawing Sheets

TRANSMITTER CIRCUIT AND OPERATION METHOD

RELATED APPLICATIONS

This application claims priority to Taiwanese Application Serial Number 109106774, filed Mar. 2, 2020, which is herein incorporated by reference.

BACKGROUND

Technical Field

The present disclosure relates to a circuit technology. More particularly, the present disclosure relates to a transmitter circuit and an operation method.

Description of Related Art

With development of technology, the signal/data transmission function is applied to many applications. Two electrical devices can transmit a signal/data to each other via the same protocol or the same technology. For example, a Type-C port of an electrical device can be connected to a Type-C port of another electrical device to transmit a signal/data to each other.

SUMMARY

Some aspects of the present disclosure are to provide a transmitter circuit. The transmitter circuit includes a slew rate control circuit, a hysteresis circuit, a logic control circuit, and an amplifier circuit. The slew rate control circuit controls a slew rate of an input signal to generate a first output signal. The hysteresis circuit generates a first control signal according to the first output signal. The logic control circuit generates a second control signal and a third control signal according to the input signal and the first control signal. The amplifier circuit generates a second output signal according to the first output signal, the second output signal, the second control signal, and the third control signal.

Some aspects of the present disclosure are to provide an operation method applied to a transmitter circuit. The operation method includes the following steps: controlling a slew rate of an input signal by a slew rate control circuit, to generate a first output signal; generating a first control signal according to the first output signal by a hysteresis circuit; generating a second control signal and a third control signal according to the input signal and the first control signal by a logic control circuit; and generating a second output signal according to the first output signal, the second output signal, the second control signal, and the third control signal by an amplifier circuit.

Based on the descriptions above, the transmitter circuit of the present disclosure has low power consumption.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
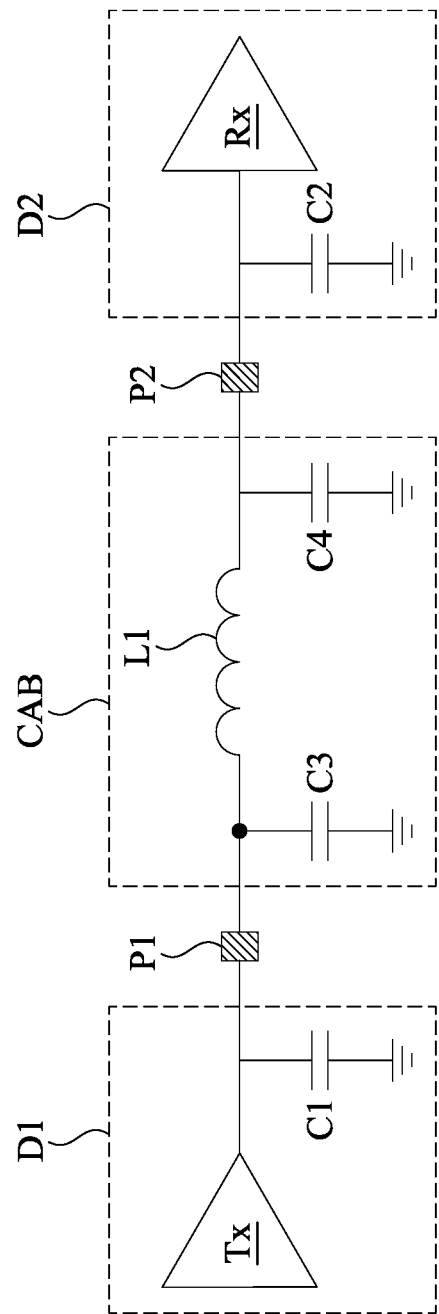
FIG. 1 is a schematic diagram illustrating an electrical system according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may refer to "electrically connected" or "electrically coupled." "Connected" or "coupled" may also refer to operations or actions between two or more elements.

Reference is made to FIG. 1. FIG. 1 is a schematic diagram illustrating an electrical system 100 according to some embodiments of the present disclosure.

As illustrated in FIG. 1, the electrical system 100 includes an electrical device D1, an electrical device D2, and a cable CAB. The electrical device D1 and the electrical device D2 are coupled to the cable CAB. In some embodiments, the electrical device D1 includes a transmitter circuit Tx and a capacitor C1. The electrical device D2 includes a receiver circuit Rx and a capacitor C2. The cable CAB includes an inductor L1, a capacitor C3, and a capacitor C4. The transmitter circuit Tx of the electrical device D1 can be coupled to the cable CAB via a pin P1, and the receiver circuit Rx of the electrical device D2 can be coupled to the cable CAB via a pin P2. Thus, the transmitter circuit Tx can transmit a signal or data to the receiver circuit Rx via the cable CAB.

In some embodiments, the electrical system 100 adopts Type-C technology. In other words, the electrical device D1, the electrical device D2, the pin P1, and the pin P2 adopt Type-C technology.

The configurations of the electrical system 100 are for illustration, and various configurations of the electrical system 100 are within the contemplated scopes of the present disclosure.

Figure 2:
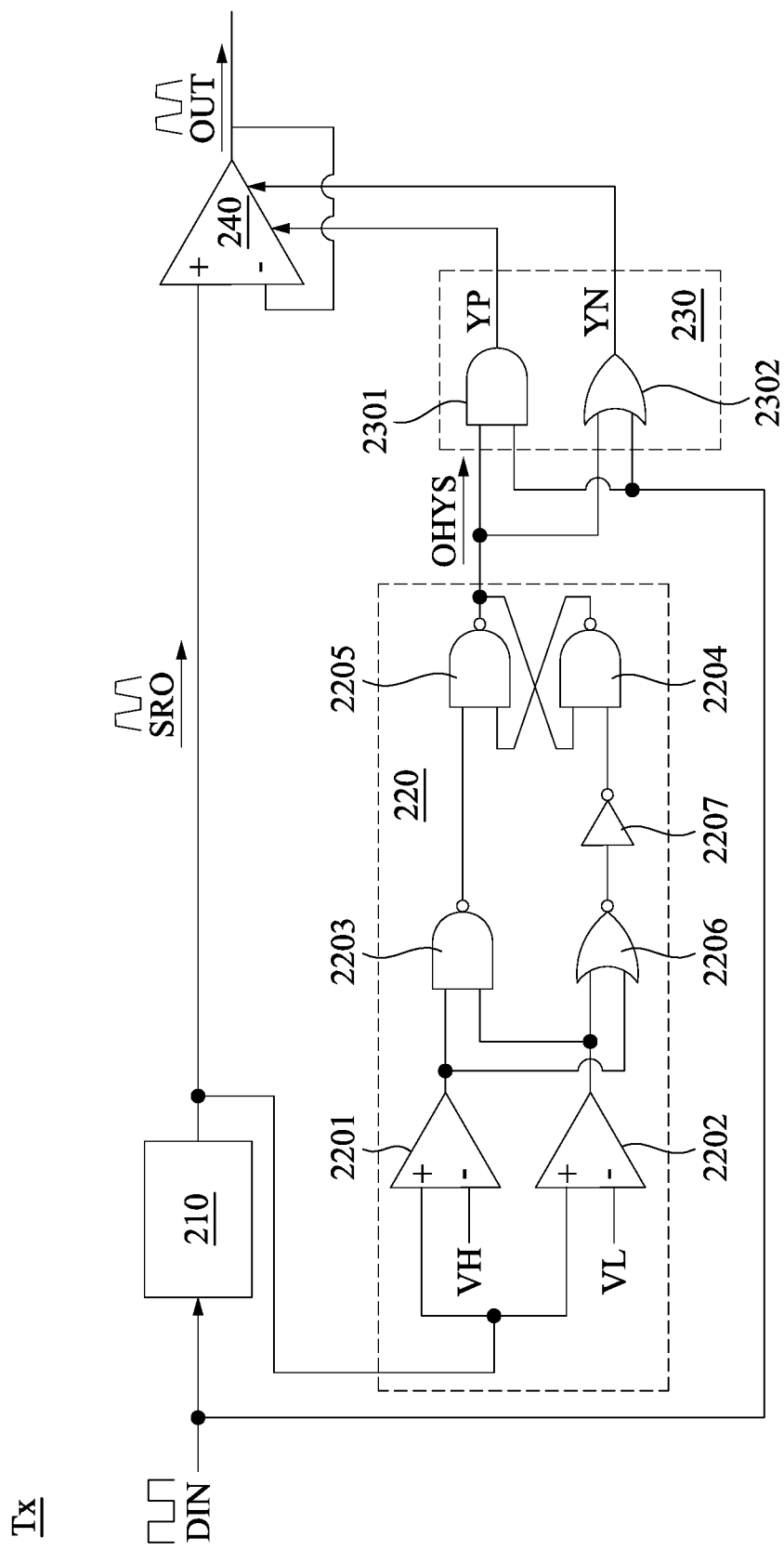
FIG. 2 is a schematic diagram illustrating a transmitter circuit in FIG. 1 according to some embodiments of the present disclosure.

Reference is made to FIG. 2. FIG. 2 is a schematic diagram illustrating the transmitter circuit Tx in FIG. 1 according to some embodiments of the present disclosure. As illustrated in FIG. 2, the transmitter circuit Tx includes a slew rate control circuit 210, a hysteresis circuit 220, a logic control circuit 230, and an amplifier circuit 240. The slew rate control circuit 210 is coupled to the hysteresis circuit 220 and the amplifier circuit 240. The logic control circuit 230 is coupled to the hysteresis circuit 220 and the amplifier circuit 240.

In operation, the slew rate control circuit 210 is configured to receive an input signal DIN. The slew rate control circuit 210 controls a slew rate of the input signal DIN, to generate an output signal SRO. As illustrated in FIG. 2, the input signal DIN is a square wave. The output signal SRO outputted from the slew rate control circuit 210 is a trapezoid wave (slew rate is smaller). In other words, the voltage variation of the output signal SRO in a unit of time is smaller. The hysteresis circuit 220 is configured to receive the output signal SRO and generate a control signal OHYS according to the output signal SRO. The logic control circuit 230 is configured to receive the input signal DIN and the control signal OHYS. The logic control circuit 230 generates a control signal YP and a control signal YN according to the input signal DIN and the control signal OHYS. The amplifier circuit 240 is configured to receive the output signal SRO and a feedback output signal OUT, and is controlled by the control signal YP and the control signal YN, to generate the output signal OUT. In some embodiments, the amplifier circuit 240 may be implemented by a unit gain buffer. Thus, the amplifier circuit 240 can generate the output signal OUT faithfully according to the output signal SRO, and transmit the output signal OUT to the cable CAB in FIG. 1 and to the receiver circuit Rx in FIG. 1, to complete the signal/data transmission.

As illustrated in FIG. 2, the hysteresis circuit 220 includes comparators 2201-2202, NAND gates 2203-2205, a NOR gate 2206, and an inverter 2207. The comparators 2201-2202 are configured to receive the output signal SRO. The comparator 2201 compares the output signal SRO with a threshold value VH. The comparator 2202 compares the output signal SRO with a threshold value VL. The NAND gate 2203 and the NOR gate 2206 are coupled to output terminals of the comparators 2201-2202. The inverter 2207 is coupled to an output terminal of the NOR gate 2206. The NAND gate 2204 is coupled to an output terminal of the inverter 2207 and an output terminal of the NAND gate 2205. The NAND gate 2205 is coupled to an output terminal of the NAND gate 2203 and an output terminal of the NAND gate 2204. The NAND gates 2204-2205 are configured to output the control signal OHYS.

The configurations of the hysteresis circuit 220 above are for illustration, and various suitable configurations of the hysteresis circuit 220 are within the contemplated scopes of the present disclosure.

In addition, as illustrated in FIG. 2, the logic control circuit 230 includes an AND gate 2301 and an OR gate 2302. The AND gate 2301 and the OR gate 2302 are configured to receive the input signal DIN and the control signal OHYS, and to respectively output the control signal YP and the control signal YN according to the input signal DIN and the control signal OHYS.

The configurations of the logic control circuit 230 above are for illustration, and various suitable configurations of the logic control circuit 230 are within the contemplated scopes of the present disclosure.

Figure 3:
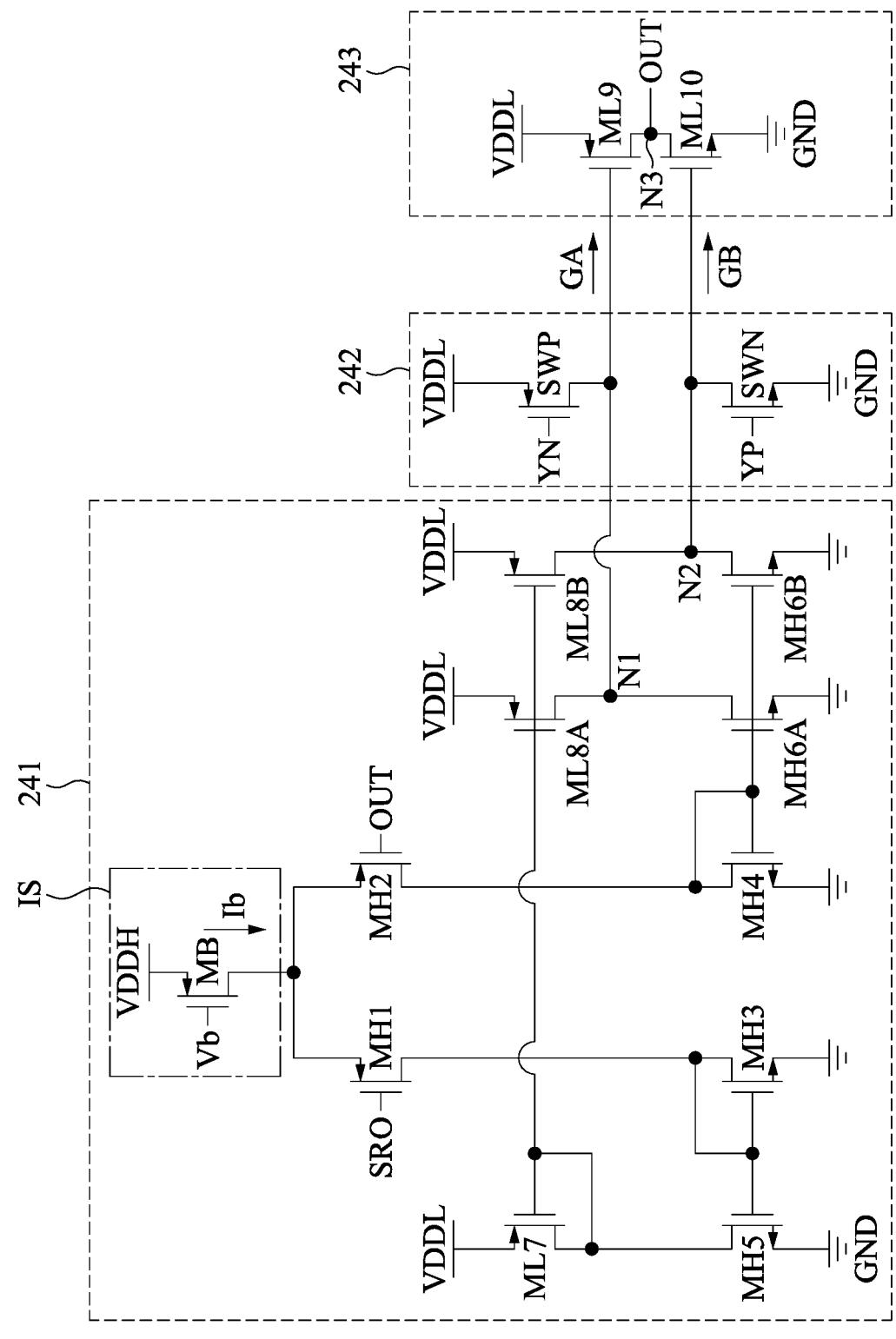
FIG. 3 is a schematic diagram illustrating an amplifier circuit in FIG. 2 according to some embodiments of the present disclosure.

Reference is made to FIG. 3. FIG. 3 is a schematic diagram illustrating the amplifier circuit 240 in FIG. 2 according to some embodiments of the present disclosure. As illustrated in FIG. 3, the amplifier circuit 240 includes a gain stage 241, a control stage 242, and an output stage 243. The gain stage 241 is configured to provide a unit gain. The control stage 242 controls the output stage 243 to output the output signal OUT according to the control signal YN and the control signal YP.

The gain stage 241 is configured to receive the output signal SRO from the slew rate control circuit 210 and the output signal OUT from the output stage 243. As illustrated in FIG. 3, the gain stage 241 includes a transistor MB, transistors MH1-MH15, transistors MH6A-MH6B, a transistor ML7, and transistors ML8A-ML8B. The transistor MB is configured to receive a power voltage VDDH and a bias voltage Vb, to generate a fixed current Ib. Effectively, the transistor MB operates as a current source circuit IS. The transistors MH1-MH2 are configured to receive the fixed current Ib and are controlled by the output signal SRO and the output signal OUT respectively. The transistor ML7 and the transistors ML8A-ML8B are configured to receive a power voltage VDDL. The transistors MH3-MH5 and the transistors MH6A-MH6B are configured to receive a ground voltage GND. The transistor MH6A and the transistor ML8A are coupled to a node N1. The transistor MH6B and the transistor ML8B are coupled at a node N2.

In some embodiments, the power voltage VDDH is higher than the power voltage VDDL. For example, the power voltage VDDL may be 1.05-1.2 volts, and the power voltage VDDH may be two times or three times the power voltage VDDL. In addition, the power voltage VDDH may be a supply voltage of an input/output device (I/O device).

The values of the power voltage VDDH and the power voltage VDDL above are for illustration, and various suitable values of the power voltage VDDH and the power voltage VDDL are within the contemplated scopes of the present disclosure.

In some related approaches, a power voltage of the current source circuit IS, e.g., the power voltage VDDL, is the same to the power voltage received by some transistors. In this situation, a head room of the gain stage 241 is not big enough, such that the gain stage 241 cannot operate normally and cannot provide a correct gain. For example, if both the transistor MB of the current source circuit IS and a transistor ML9 configured to generate the output signal OUT (transmitted to a gate terminal of the transistor MH2) receive the power voltage VDDL, the transistor MH2 cannot operate normally when the output signal OUT is the power voltage VDDL, such that the gain stage 241 cannot provide the correct gain. Based on descriptions above, in other related approaches, an additional enhancement stage circuit is configured to ensure that the gain stage 241 can operate normally. However, the additional enhancement stage circuit increases the circuit area and cost.

Compared to the related approaches above, in the gain stage 241 of the present disclosure, the transistor MB of the current source circuit IS is configured to receive the power voltage VDDH, and the power voltage VDDH is higher than the power voltage VDDL. In this situation, the head room of the gain stage 241 is enough, so it can prevent the problems described above. Accordingly, the gain stage 241 can operate normally to provide the correct gain without incorporating the enhancement stage circuit.

The configurations of the gain stage 241 above are for illustration only, and various suitable configurations of the gain stage 241 are within the contemplated scopes of the present disclosure.

The control stage 242 is configured to generate a gate signal GA and a gate signal GB according to the control signal YN and the control signal YP respectively. As illustrated in FIG. 3, the control stage 242 includes a transistor SWP and a transistor SWN. The transistor SWP is configured to receive the power voltage VDDL and is controlled by the control signal YN, to generate the gate signal GA at the node N1. The transistor SWN is configured to receive the ground voltage GND and is controlled by the control signal YP to generate the gate signal GB at the node N2.

The output stage 243 is configured to generate the output signal OUT according to the gate signal GA and the gate signal GB. As illustrate in FIG. 3, the output stage 243 includes the transistor ML9 and a transistor ML10. The transistor ML9 and the transistor ML10 are coupled at a node N3, to generate the output signal OUT at the node N3. To be more specific, the transistor ML9 is configured to receive the power voltage VDDL, and is coupled to the node N1 so that the transistor ML9 is controlled by the gate signal GA. The transistor ML10 is configured to receive the ground voltage GND, and is coupled to the node N2 so that the transistor ML10 is controlled by the gate signal GB.

Figure 4:
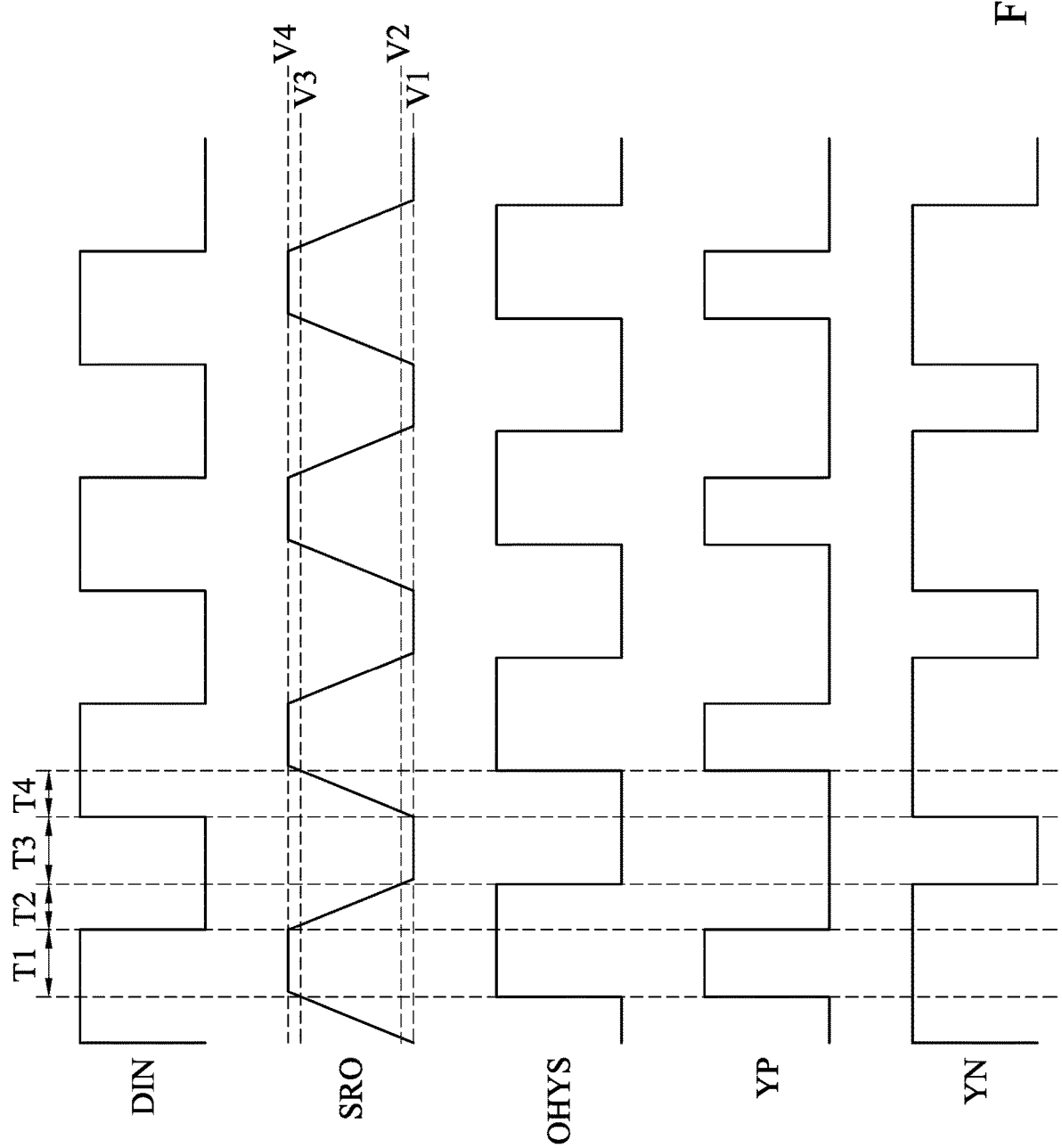
FIG. 4 is a waveform diagram illustrating waveforms of signals in FIG. 2 and FIG. 3 according to some embodiments of the present disclosure.

Reference is made to FIG. 2, FIG. 3, and FIG. 4. FIG. 4 is a waveform diagram illustrating waveforms of signals in FIG. 2 and FIG. 3 according to some embodiments of the present disclosure. FIG. 4 illustrates the waveforms of the input signal DIN, the output signal SRO, the control signal OHYS, the control signal YP, and the control signal YN.

As illustrated in FIG. 4, the input signal DIN is the square wave. The output signal SRO outputted by the slew rate control circuit 210 is the trapezoid wave (smaller slew rate). The output signal SRO is defined to have a voltage value V1, a voltage value V2, a voltage value V3, and a voltage value V4. The voltage value V1, the voltage value V2, the voltage value V3, and the voltage value V4 correspond to 0%, 10%, 90%, and 100% respectively. In some embodiments, the control signals OHYS and YP can be preset to be a low logic level. The control signal YN can be preset to be a high logic level. Accordingly, the transistor SWN and the transistor SWP of the control stage 242 are preset to be turned off.

Based on operations of the hysteresis circuit 220, when the output signal SRO rises from a voltage value V3 to a voltage value V4, keeps at the voltage value V4 for a period of time, and falls from the voltage value V4 to the voltage V2 (i.e., a time duration T1 and a time duration T2), the control signal OHYS has a high logic level. When the output signal SRO falls from the voltage value V2 to a voltage value V1, keeps at the voltage value V1 for a period of time, and rises from the voltage value V1 to the voltage value V3 (i.e., a time duration T3 and a time duration T4), the control signal OHYS has the a low logic level.

During the time period T1, since the input signal DIN has a high logic level, and the control signal OHYS has a high logic level, the control signal YP outputted by the NAND gate 2301 has a high logic level. In this situation, the transistor SWN in FIG. 3 is turned on. Since the transistor SWN is turned on, the gate signal GB at the node N2 is pulled to the ground voltage GND. Accordingly, the transistor ML10 is turned off completely.

During the time period T3, since the input signal DIN has the low logic level, and the control signal OHYS has the low logic level, the control signal YN outputted by the OR gate 2302 has a low logic level. In this situation, the transistor SWP in FIG. 3 is turned on. Since the transistor SWP is turned on, the gate signal GA at the node N1 is pulled down to the power voltage VDDL. Accordingly, the transistor ML9 is turned off completely.

In some related approaches, the transistor ML9 and the transistor ML10 are turned on simultaneously during the time period T1 or the time period T3, such that a direct current flows through the transistor ML9 and the transistor ML10. Compared to these related approaches, the transistor ML9 and the transistor ML10 of the present disclosure are controlled by different gate signals (the gate signal GA/the gate signal GB) respectively. In addition, the transistor ML10 of the present disclosure is turned off completely during the time period T1, and the transistor ML9 of the present disclosure is turned off completely during the time period T3. Accordingly, it can prevent transistor ML9 and the transistor ML10 from being turned on simultaneously, to prevent a current from flowing through the transistor ML10 and the transistor ML9, so as to reduce power consumption. Furthermore, since the transmitter circuit Tx accounts for a large proportion of power consumption in the entire chip, the transmitter circuit Tx of the present disclosure with low power consumption can reduce power consumption of the entire chip drastically.

In addition, the transmitter circuit Tx of the present disclosure is a feedforward system, and thus it can prevent an output of the circuit from being locked. On the other hand, the threshold value VH inputted into the comparator 2201 or threshold value VL inputted into the comparator 2202 can be designed according to the requirement of the system, to ensure the completeness of the signals, so as to satisfy specification standards. For example, it can satisfy Type-C specification standards.

The turning-on level or the turning-off level of the signals are for illustration, and he turning-on level or the turning-off level of the signals can be designed with respect to types of the elements (for example, transistors) in the circuit.

Figure 5:
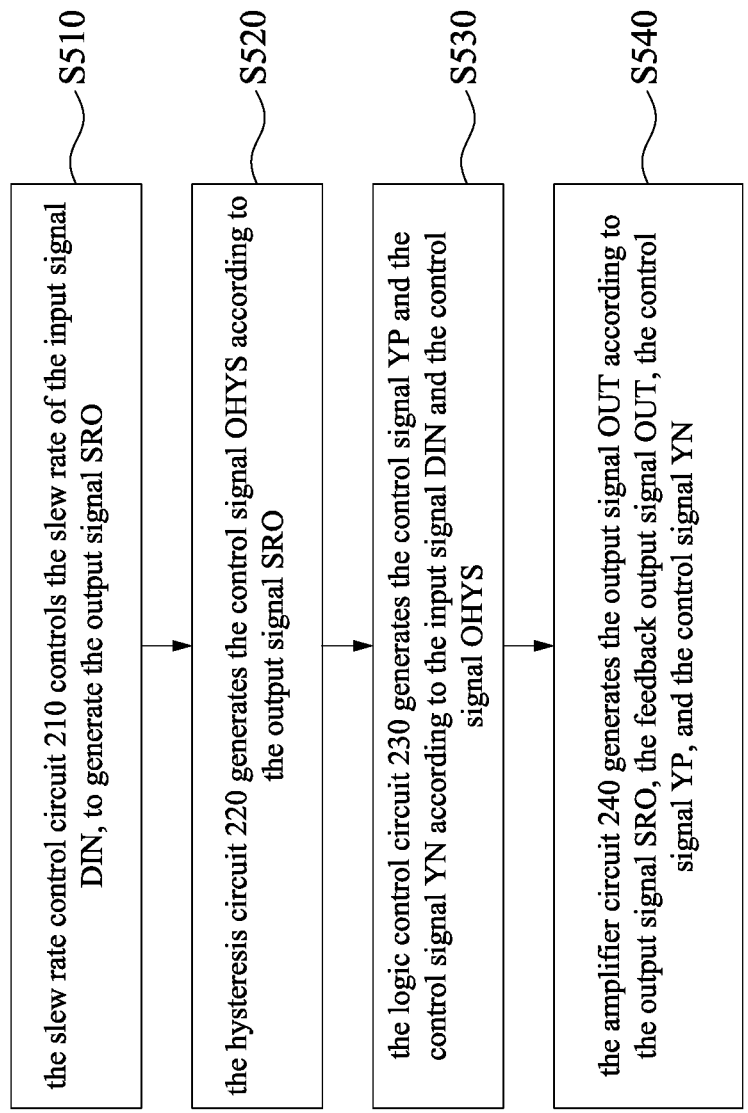
FIG. 5 is a flow diagram illustrating operations of an operation method according to some embodiments of the present disclosure.

Reference is made to FIG. 5. FIG. 5 is a flow diagram illustrating operations of an operation method 500 according to some embodiments of the present disclosure. The operation method 500 includes steps S510, S520, S530, and S540. In some embodiments, the operation method 500 is applied to the transmitter circuit Tx in FIG. 2, but the present disclosure is not limited thereto. For ease of understanding, the operation method 500 is discussed with FIG. 1-FIG. 4.

In step S510, the slew rate control circuit 210 controls the slew rate of the input signal DIN to generate the output signal SRO. In some embodiments, the input signal DIN is the square wave. The slew rate control circuit 210 controls the slew rate of the input signal DIN to generate a required signal (for example, the output signal SRO)(trapezoid wave).

In step S520, the hysteresis circuit 220 generates the control signal OHYS according to the output signal SRO. The hysteresis circuit 220 may be implemented by various logic gates, and the present disclosure is not limited to the hysteresis circuit 220 illustrated in FIG. 2.

In step S530, the logic control circuit 230 generates the control signal YP and the control signal YN according to the input signal DIN and the control signal OHYS. Similarly, the logic control circuit 230 may be implemented by various logic gates, and the present disclosure is not limited to the logic control circuit 230 illustrated in FIG. 2.

In operation S540, the amplifier circuit 240 generates the output signal OUT according to the output signal SRO, the feedback output signal OUT, the control signal YP, and the control signal YN. In some embodiments, the control signal YP is configured to control the transistor SWN of the control stage 242 of the amplifier circuit 240, and the control signal YN is configured to control the transistor SWP of the control stage 242 of the amplifier circuit 240, so as to control the gate signal GA and the gate signal GB. The gate signal GA and the gate signal GB are configured to control the transistor ML9 and the transistor ML10 respectively, to prevent the transistor ML9 and the transistor ML10 from being turned on simultaneously. Thus, low power consumption can be achieved.

Based on the descriptions above, the transmitter circuit of the present disclosure has low power consumption.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transmitter circuit, comprising:
    a slew rate control circuit configured to control a slew rate of an input signal to generate a first output signal;
    a hysteresis circuit configured to generate a first control signal according to the first output signal;
    a logic control circuit configured to generate a second control signal and a third control signal according to the input signal and the first control signal; and
    an amplifier circuit configured to generate a second output signal according to the first output signal, the second output signal, the second control signal, and the third control signal.

2. The transmitter circuit of claim 1, wherein the first control signal has a first logic level when the first output signal rises from a first voltage to a second voltage, has the second voltage, and falls from the second voltage to a third voltage.

3. The transmitter circuit of claim 2, wherein the first control signal has a second logic level when the first output signal falls from the third voltage to a fourth voltage, has the fourth voltage, and rises form the fourth voltage to the first voltage.

4. The transmitter circuit of claim 1, wherein when the input signal and the first control signal have a first logic level, the second control signal has the first logic level.

5. The transmitter circuit of claim 4, wherein when the input signal and the first control signal have a second logic level, the third control signal has the second logic level.

6. The transmitter circuit of claim 1, wherein the amplifier circuit comprises:
    a gain stage configured to receive the first output signal and the second output signal;
    a control stage configured to generate a first gate signal and a second gate signal according to the second control signal and the third control signal respectively; and
    an output stage configured to generate the second output signal according to the first gate signal and the second gate signal.

7. The transmitter circuit of claim 6, wherein the control stage comprises:
    a first transistor configured to receive a first power voltage and controlled by the third control signal, to generate the first gate signal; and
    a second transistor configured to receive a ground voltage and controlled by the second control signal, to generate the second gate signal.

8. The transmitter circuit of claim 7, wherein the output stage comprises:
    a third transistor configured to receive the first power voltage and controlled by the first gate signal; and
    a fourth transistor configured to receive the ground voltage and controlled by the second gate signal,
    wherein the fourth transistor and the third transistor are coupled at a node and the second output signal is generated at the node.

9. The transmitter circuit of claim 7, wherein a current source circuit of the gain stage is configured to receive a second power voltage and a bias voltage to operate, wherein the second power voltage is greater than the first power voltage.

10. The transmitter circuit of claim 1, wherein the transmitter circuit is disposed in a Type-C device.

11. An operation method applied to a transmitter circuit, wherein the operation method comprises:
    controlling a slew rate of an input signal by a slew rate control circuit, to generate a first output signal;
    generating a first control signal according to the first output signal by a hysteresis circuit;
    generating a second control signal and a third control signal according to the input signal and the first control signal by a logic control circuit; and
    generating a second output signal according to the first output signal, the second output signal, the second control signal, and the third control signal by an amplifier circuit.

12. The operation method of claim 11, wherein the first control signal has a first logic level when the first output signal rises from a first voltage to a second voltage, has the second voltage, and falls from the second voltage to a third voltage.

13. The operation method of claim 12, wherein the first control signal has a second logic level when the first output signal falls from the third voltage to a fourth voltage, has the fourth voltage, and rises form the fourth voltage to the first voltage.

14. The operation method of claim 11, wherein when the input signal and the first control signal have a first logic level, the second control signal has the first logic level.

15. The operation method of claim 14, wherein when the input signal and the first control signal have a second logic level, the third control signal has the second logic level.

16. The operation method of claim 11, wherein generating the second output signal according to the first output signal, the second output signal, the second control signal, and the third control signal by the amplifier circuit comprises:
    receiving the first output signal and the second output signal by a gain stage of the amplifier circuit;
    generating a first gate signal and a second gate signal according to the second control signal and the third control signal respectively by a control stage of the amplifier circuit; and
    generating the second output signal according to the first gate signal and the second gate signal by an output stage of the amplifier circuit.

17. The operation method of claim 16, wherein generating the first gate signal and the second gate signal by the control stage of the amplifier circuit comprises:

receiving a first power voltage by a first transistor of the control stage to generate the first gate signal, wherein the first transistor is controlled by the third control signal; and receive a ground voltage by a second transistor of the control stage to generate the second gate signal, wherein the second transistor is controlled by the second control signal.

18. The operation method of claim 17, wherein generating the second output signal according to the first gate signal and the second gate signal by the output stage of the amplifier circuit comprises:

receiving the first power voltage by a third transistor of the output stage, wherein the third transistor is controlled by the first gate signal; and receiving the ground voltage by a fourth transistor of the output stage, wherein the fourth transistor is controlled by the second gate signal, wherein the fourth transistor and the third transistor are coupled at a node and the second output signal is generated at the node.

19. The operation method of claim 17, wherein a current source circuit of the gain stage is configured to receive a second power voltage and a bias voltage to operate, wherein the second power voltage is greater than the first power voltage.

20. The operation method of claim 11, wherein the transmitter circuit is disposed in a Type-C device.

* * * * *